US009170572B2

United States Patent
MacArthur et al.

(10) Patent No.: US 9,170,572 B2
(45) Date of Patent: Oct. 27, 2015

(54) DYNAMIC MODEL GENERATION FOR IMPLEMENTING HYBRID LINEAR/NON-LINEAR CONTROLLER

(75) Inventors: Ward MacArthur, Scottsdale, AZ (US); Sriram Hallihole, Karnataka (IN); Ranganathan Srinivasan, Karnataka (IN); Madhukar Madhavamurthy Gundappa, Karnataka (IN); Mandar Subhash Vartak, Karnataka (IN); Gobinath Pandurangan, Karnataka (IN); S. Chandrakanth Vittal, Bangalore (IN); Lucy Ning Liu, Peoria, AZ (US); Sanjay Kantilal Dave, Karnataka (IN); Avijit Das, Karnataka (IN); Sreesathya Sathyabhama Sreekantan, Tamilnadu (IN); Roshan Yohannan, Karnataka (IN); Rajni Jain, Karnataka (IN)

(73) Assignee: Honeywell International Inc., Morristown, NJ (US)

( * ) Notice: Subject to any disclaimer, the term of this patent is extended or adjusted under 35 U.S.C. 154(b) by 518 days.

(21) Appl. No.: 13/177,356

(22) Filed: Jul. 6, 2011

(65) Prior Publication Data

US 2013/0013086 A1    Jan. 10, 2013

(51) Int. Cl.
  G05B 13/02    (2006.01)
  G06G 7/48     (2006.01)
  G05B 13/04    (2006.01)
  G06F 17/50    (2006.01)

(52) U.S. Cl.
  CPC .............. G05B 13/04 (2013.01); G06F 17/50 (2013.01); G06F 17/5004 (2013.01)

(58) Field of Classification Search
  CPC ........................................................ G05B 1/00
  USPC .................................................. 700/29; 703/6
  See application file for complete search history.

(56) References Cited

U.S. PATENT DOCUMENTS

| 6,826,521 B1 * | 11/2004 | Hess et al. ....................... 703/12 |
| 6,934,931 B2 * | 8/2005 | Plumer et al. .................. 717/104 |
| 7,006,900 B2 * | 2/2006 | Zhenduo et al. .............. 700/299 |

(Continued)

OTHER PUBLICATIONS

Jonas Sjoberg, et al., "Nonlinear Black-box Modeling in System Identification: a Unified Overview", Automatica, vol. 31, No. 12, pp. 1691-1724 (1995).

(Continued)

*Primary Examiner* — Mohammad Ali
*Assistant Examiner* — Ziaul Karim
(74) *Attorney, Agent, or Firm* — Jetter & Associates, P.A.

(57) ABSTRACT

A method of dynamic model selection for hybrid linear/non-linear process control includes developing a plurality of process models including at least one linear process model and at least one non-linear process model from inputs including dynamic process data from a processing system that runs a physical process. At least two of the plurality of process models are selected based on a performance comparison based on at least one metric, wherein the selected process models number less than a number of the plurality of process models received. A multi-model controller is generated that includes the selected process models. The physical process is simulated using the multi-model controller by applying the selected process models to obtain closed loop performance test data for each of the selected models. The performance test data is compared. A selected process model is then selected.

8 Claims, 3 Drawing Sheets

(56) References Cited

U.S. PATENT DOCUMENTS

| | | | |
|---|---|---|---|
| 7,065,511 B2* | 6/2006 | Zhao et al. | 706/21 |
| 7,933,762 B2* | 4/2011 | Pinto et al. | 703/22 |
| 8,036,760 B2* | 10/2011 | Mehta et al. | 700/29 |
| 8,185,217 B2* | 5/2012 | Thiele | 700/29 |
| 8,374,709 B2* | 2/2013 | Lou | 700/50 |
| 2001/0049595 A1* | 12/2001 | Plumer et al. | 703/22 |
| 2002/0178133 A1* | 11/2002 | Zhao et al. | 706/21 |
| 2008/0065241 A1* | 3/2008 | Boe et al. | 700/44 |
| 2008/0077382 A1* | 3/2008 | Strehl | 703/20 |
| 2008/0183311 A1* | 7/2008 | MacArthur et al. | 700/29 |
| 2009/0043546 A1* | 2/2009 | Srinivasan et al. | 703/2 |
| 2009/0054998 A1* | 2/2009 | Beerbaum | 700/29 |
| 2009/0177291 A1* | 7/2009 | Boe et al. | 700/29 |
| 2011/0167025 A1* | 7/2011 | Danai et al. | 706/12 |
| 2012/0022670 A1* | 1/2012 | Boe et al. | 700/29 |

OTHER PUBLICATIONS

Lennart L Jung, "System Identification Toolbox User's Guide", Matlab & Simulink, The MathWorks, Inc., 2013.

Lennart L Jung, "System Identification: Theory for the User", University of Linkoping, Sweden, 1987, Prentice-Hall, Inc., Englewood Cliffs. New Jersey, Title Page and pp. 71-78.

* cited by examiner

EXAMPLE: MANUFACTURING OF POLY-ETHYLENE USING A FLUIDIZED BED REACTOR

|  | C4 FLOW | H2 FLOW | CATALYST | PURGE | TEMP | IC5 FLOW | N2 FLOW |
|---|---|---|---|---|---|---|---|
| CUM MI | BB | GB | GB | GB | BB | / | GB |
| CUM POLYDEN | GB | GB | BB | GB | GB | / | GB |
| PROD RATE | GB | BB | GB | BB | BB | / | BB |
| C2 PARPRESS | BB | BB | GB | BB | GB | / | GB |
| CONDENSATES | WB | WB | WB | WB | WB | / | WB |

BB - BLACK BOX  GB - GREY BOX  WB - WHITE BOX

NON-LINEAR MODELS

LINEAR MODELS

*FIG. 3*

DYNAMIC MODEL GENERATION FOR IMPLEMENTING HYBRID LINEAR/NON-LINEAR CONTROLLER

FIELD

Disclosed embodiments relate to feedback control systems, more specifically to process control using model predictive controllers.

BACKGROUND

Processing facilities, such as manufacturing plants, chemical plants and oil refineries, are typically managed using process control systems. Valves, pumps, motors, heating/cooling devices, and other industrial equipment typically perform actions needed to process materials in the processing facilities. Among other functions, the process control systems often manage the use of the industrial equipment in the processing facilities.

In conventional process control systems, controllers are often used to control the operation of the industrial equipment in the processing facilities. The controllers can typically monitor the operation of the industrial equipment, provide control signals to the industrial equipment, and/or generate alarms when malfunctions are detected. Process control systems typically include one or more process controllers and input/output (I/O) devices communicatively coupled to at least one workstation and to one or more field devices, such as through analog and/or digital buses. The field devices can include sensors (e.g., temperature, pressure and flow rate sensors), as well as other passive and/or active devices. The process controllers can receive process information, such as field measurements made by the field devices, in order to implement a control routine. Control signals can then be generated and sent to the industrial equipment to control the operation of the process. Advanced controllers often use model-based control techniques to control the operation of the industrial equipment. Model-based control techniques typically involve using an empirical model to analyze input data, where the model identifies how the industrial equipment should be controlled based on the input data being received.

Model predictive controllers (MPCs) rely on dynamic models of the process, most often linear empirical models obtained by system identification. The models are used to predict the behavior of dependent variables (e.g. outputs) of a dynamic system with respect to changes in the process independent variables (e.g. inputs). In chemical processes, independent variables are most often setpoints of regulatory controllers that govern valve movement (e.g., valve positioners with or without flow, temperature or pressure controller cascades), while dependent variables are most often constraints in the process (e.g., product purity, equipment safe operating limits). The MPC uses the models and current plant measurements to calculate future moves in the independent variables that will result in operation that attempts to satisfy all independent and dependent variable constraints. The MPC then sends this set of independent variable to move to the corresponding regulatory controller setpoints to be implemented in the process.

In certain control systems, a difficulty may arise in operating different processes with characteristically different operating regimes. For example, some manufacturing processes, such as multi-variable chemical processes, may require control of both linear processes and non-linear processes simultaneously or successively for needed process control. Conventional controllers utilize a separate linear MPC and a non-linear MPC to handle each individual task.

SUMMARY

Disclosed embodiments recognize that conventional model predictive controllers (MPCs) that include separate non-linear and linear controllers reduce efficiency of the overall control process by increasing switchover times and absorbing more of the user's time. Further, switchover may not be seamless which may cause a brief loss in control which can affect the integrity (e.g., degraded performance) of the process.

Disclosed embodiments include systems for dynamic model selection including dynamic linear or non-linear model selection for controlling physical processes, and methods of dynamic model selection for implementing "hybrid" linear/non-linear process control of a physical process. Disclosed "hybrid" process control enables hybrid process controllers that can provide either linear or non-linear control, that can be switched between linear or non-linear control depending on their closed loop behavior evidenced in off-line simulations. Disclosed embodiments thus enable integrating linear and non-linear control into a unified interface available to users. The unified interface may comprise a computer program that displays a control interface on a suitable display device. The unified interface may offer manual or automatic selection of, or switching between, the available linear and non-linear control modes.

BRIEF DESCRIPTION OF THE DRAWINGS

FIG. 3 is a table that displays the manipulated variable (MV)-controlled variable (CV) model matrix created for an example polyethylene (PE)-Fluidized Bed Reactor (FBR) process, according to a disclosed embodiment.

DETAILED DESCRIPTION

Figure 1:
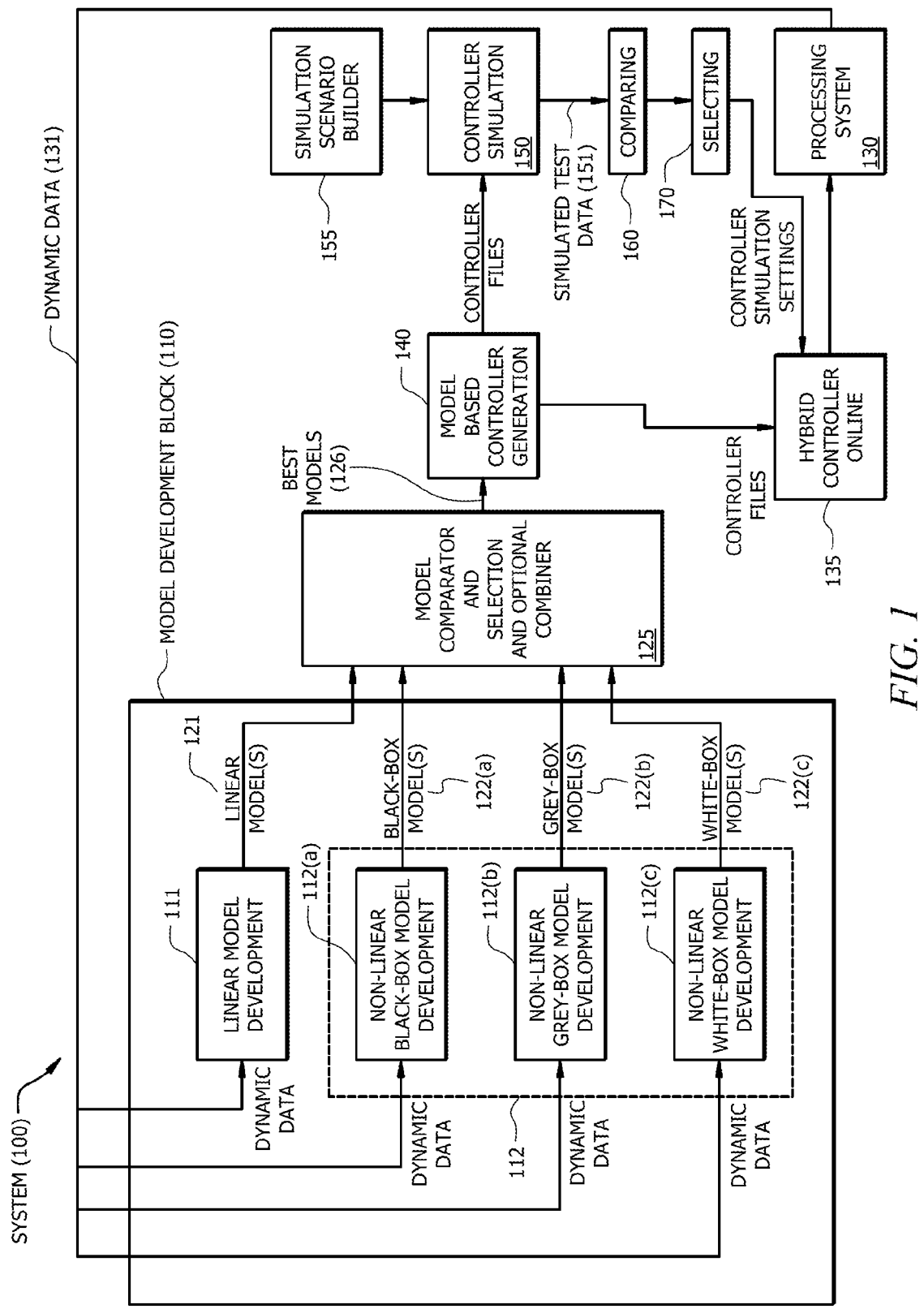
FIG. 1 is a block diagram of an example system for dynamic model selection including dynamic linear or non-linear model selection for controlling physical processes, according to an example embodiment.

Disclosed embodiments are described with reference to the attached figures, wherein like reference numerals are used throughout the figures to designate similar or equivalent elements. The figures are not drawn to scale and they are provided merely to illustrate certain disclosed aspects. Several disclosed aspects are described below with reference to example applications for illustration. It should be understood that numerous specific details, relationships, and methods are set forth to provide a full understanding of the disclosed embodiments. One having ordinary skill in the relevant art, however, will readily recognize that the subject matter disclosed herein can be practiced without one or more of the specific details or with other methods. In other instances, well-known structures or operations are not shown in detail to avoid obscuring certain aspects. This Disclosure is not limited by the illustrated ordering of acts or events, as some acts may occur in different orders and/or concurrently with other acts or events. Furthermore, not all illustrated acts or events are required to implement a methodology in accordance with the embodiments disclosed herein.

Disclosed embodiments include applying MPC technology to non-linear physical processes using a hybrid controller which can provide either linear or non-linear control, and switch between non-linear and linear control. Disclosed systems allow the user to develop both linear models and non-linear models in a single environment and create a MPC that controls the physical process in real-time.

Referring to FIG. 1, an example system 100 for dynamic model selection for controlling physical processes according to an example embodiment is shown. System 100 includes a model development block 110 shown including a linear model development block 111 that generates at least one linear process model 121, and a non-linear model development block 112 that generates at least one non-linear process model. Non-linear model development block 112 is shown in FIG. 1 including a black box model development block 112(a) that generates at least one black box model, a grey box model development block 112(b) that generates at least one gray box model 122(b), and a white box model development block 112(c) that generates at least one white box model 122(c). Inputs to model development block 110 include dynamic process data 131 (e.g., a plurality of measured variables (MVs)) from a processing system 130 that runs a physical process, and optional inputs including the type of physical process (e.g., polymer manufacturing or oil refining) and a-priori known parameter relationships/correlations for the particular processes, including some correlations that are known not to exist. The term "Grey-Box" as used herein indicates that if the user is aware of any a-priori information about the process, then that information may be included in the model development.

The linear process model(s) 121 developed by the linear model development block 111 can include, but are not limited to, finite impulse response (FIR), closed loop identification (CLID), prediction error method (PEM) and combinations thereof. Although the non-linear models generated are shown as empirical data-based models such as black-box (BB) model(s) 122(a), grey-box (GB) model(s) 122(b), and first-principle models such as white-box (WB) model(s) 122(c), other non-linear models may be generated. Within BB model(s) 122(a), the user may develop non-linear autoregressive with exogenous inputs (NARX) and non-linear output error (NOE) types of empirical data-based models. Within GB model(s) 122(b), the user can develop Hammerstein, Wiener and Hammerstein-Wiener type of empirical data-based models.

In one embodiment, a model merging strategy is used by the model development block 110 that involves reducing a representation of the processing system into two or more sub-systems which each include one or more CVs of the processing system, for which model development to form each sub-model is performed independently for each sub-system, followed by model merger of the sub-models. For example, consider a processing system which includes 7 CVs and 4 MVs. Model development for this system can be performed by separating the system into two (or more) sub-systems. A first sub-system can include 4 CVs and 4 MVs, and a sub-model can be developed for the first sub-system. The second sub-system can include the rest of system in the 2 sub-system case, being the 3 remaining CVs and the 4 MVs, and model development is then performed on the second sub-system. To obtain the model for the original system the sub-models developed for both first and second sub-systems are merged to provide a model for the original system (7 CVs and 4 MVs). In one embodiment one of the sub-models is a linear model and one of the sub-models is a non-linear model so the merged model is hybrid model that includes both a linear model portion and a non-linear model portion.

System 100 includes a model comparator and selection and optional combiner block 125 that can be based on metrics including sensitivity plots (some kind of ranking based on smoothness, etc), Linear Model Rank (where applicable), R2 fit, Fit percentage and Normalized Mean Squared Error (MSE). Block 125 selects the best performing models from the models provided (121, 122(a), 122(b), 122(c)) based on the metrics used. The best models selected by block 125 shown as best models 126 include two or more of the models provided, number less than the number of process models received from model development block 110, and generally include at least one linear model and at least one non-linear model. In one embodiment at least one of the models output by model comparator and selection and optional combiner block 125 is a hybrid model that includes the combination of a non-linear portion and a linear portion, such as a linear model for at least one parameter relation and a non-linear model for at least one other parameter relation.

A model-based controller generation block 140 is coupled to receive the models selected by comparator and selection and optional combiner block 125 to generate a multi-model comprising controller therefrom. System 100 includes a controller simulator block 150 that receives controller files from model-based controller generation block 140 for simulating the physical process to obtain closed loop performance simulated test data 151 for each of the plurality of process models simulated. System 100 also includes a simulation scenario builder 155. Simulation scenario builder 155 defines process parameters and provides operating points and ranges.

A comparing block 160 is coupled to the simulator block 150 for comparing the closed loop performance test data for the models simulated obtained by controller simulations performed by controller simulation block 150. A selecting block 170 is for selecting a selected process model from the plurality of process models simulated. The output of the selecting block 170 comprises information regarding the selected process model (e.g., grey box model is the selected model) that is coupled to a hybrid linear/non-linear process controller 135 shown in FIG. 1 to be on-line and connected to the processing system 130.

Disclosed hybrid controllers are generally MPCs that may employ successive linearization techniques along with state estimation techniques to reject unmeasured disturbances as fast as possible. The successive linearization strategy can result in State-Space matrices and the non-linear model predictive controller can be based on this state space model. The state-space matrices allow seamless switching between a linear and non-linear controller.

A state-estimator may be based on Kalman filtering concepts. An unforced forward prediction may be run with two or more methods. The unforced forward prediction may be based on velocity model norms. A first method may use the traditional step response coefficients obtained from a linearized model of the controlled system to compute the unforced prediction. In the second method, the unforced forward prediction may be obtained using the linearized state-space model with the initial condition being the Kalman corrected state at every cycle.

Figure 2:
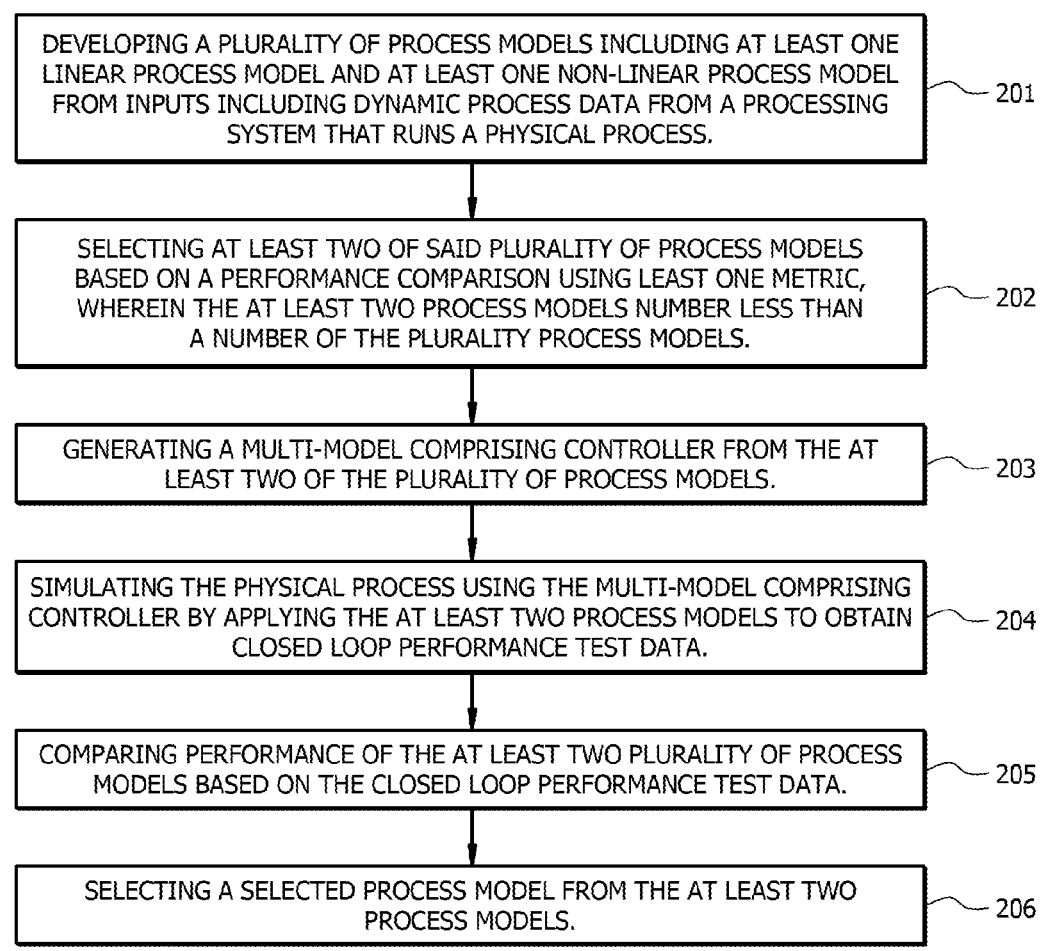
FIG. 2 is a flow chart of an example method of dynamic model selection for hybrid linear/non-linear process control, according to an example embodiment.

Further disclosed is an example method of dynamic model selection for hybrid linear/non-linear process control. Referring to flow chart shown in FIG. 2, the method 200 includes step 201 that comprises developing a plurality of process models including at least one linear process model and at least one non-linear process model from inputs including dynamic process data from a processing system that runs a physical process.

Step 202 comprises feeding the set of models developed in step 201 (including both linear and non linear models) into a model comparator and selector and optional model combiner, which selects the best linear and non-linear models based on a performance comparison using at least one metric, or generates a combined model, such as based on sensitivity plots (some kind of ranking based on smoothness, etc), Linear Model Rank (where applicable), R2 fit, Fit percentage and Normalized Mean Squared Error (MSE). As noted above, the models selected include two or more of the models developed, number less than the number of process models developed, and generally include at least one linear model and at least one non-linear model.

The model comparator and selector can be pre-configured with different stored algorithms for choosing only selected models from the developed models for controller generation. For example, an example simple algorithm may measure the fit % of the respective models, and select only those developed models that provide a minimum fit % (e.g. ≥50%). The model comparison can be fully or partially automated. In the fully automated case, the system can select the best of the developed model based on different criteria's set, and in the partially automated case may call for user interventions for choosing the best models. In one embodiment at least one model output by model comparator and selection or combiner block 125 is a hybrid model that includes the combination of a non-linear portion and a linear portion, such as a linear model for at least one parameter relation and a non-linear model for the one other parameter relation.

Step 203 comprises generating a multi-model comprising controller that includes the selected models, which may include at least one hybrid model which can include at least one linear and at least one non-linear model. Step 204 comprises simulating the physical process using the multi-model comprising controller by applying the selected process models to obtain closed loop performance simulation test data for each of the process models simulated.

Step 205 comprises comparing the performance of the closed loop performance simulated test data obtained from each of the plurality of process models. Step 206 comprises selecting a selected process model from the plurality of process models that were simulated. Method 200 can include an optional step which makes method 200 an on-line process control method by coupling information regarding the selected process model (e.g., grey box model is the selected model) to a hybrid linear/non-linear process controller that is connected on-line to the processing system.

Disclosed embodiments can be applied to generally controlling a variety of physical processes, for example but not limited to manufacturing processes such as paper manufacturing, pH control, polymer manufacturing, ammonia synthesis, distillation columns. However, disclosed hybrid MPCs can be used with systems involving physical processes that may result in other types of end products, such as control of a gas turbine powering an aircraft.

EXAMPLES

Disclosed embodiments are further illustrated by the following specific Examples, which should not be construed as limiting the scope or content of this Disclosure in any way.

Manufacturing of Polyethylene (PE) Using a Fluidized Bed Reactor (FBR)

In this example polyethylene is manufactured by the polymerization of the monomer ethylene using a processing system including a FBR that implements a PE-FBR process. Significant outputs for control are Cumulative Melt Index (Cum MI), Cumulative Polymer Density (Cum PolyDen), Production Rate (ProdRate), Ethylene Partial Pressure (C2 PP) and Condensates (COND). The key Inputs that can be manipulated for the processing system are Butene Flow (C4 flow), Hydrogen Flow (H2 flow), Catalyst Flow (Cat flow), Reactor Temperature Set-Point (Temp), Iso-Pentane Flow (IC5 flow) and Nitrogen Flow (N2 flow). The Dynamic time series data for the inputs and outputs are obtained from plant. It contains both the historical data as well as data from a few carefully conducted earlier experiments to identify/validate the black-box/grey-box models. Partial a-priori process knowledge of PE-FBR process such as balances, reaction mechanism, kinetics and thermodynamics are known and are used to construct the white-box model.

FIG. 3 is a table that displays the MV-CV model matrix created for the example PE-FBR process. For condensates a White-Box (a non-linear) model has been identified with respect to all MVs. IC5 flow (MV) is found to have Linear model with all CVs. Other outputs contain a mix and match of both Grey-Box and Black-Box models (both Grey-Box and Black-Box are non-linear models).

In Scenario-1, Non-Linear Black Box models are identified using plant data. NARX models of various orders are identified. NOE models of various orders are identified. In Scenario-2, Non-Linear Grey Box models are identified using plant data and with partial knowledge on the time constants and delays for few sub models. Hammerstein models, Wiener models and Hammerstein-Wiener models are identified. In Scenario-3, a mix and match of Grey Box and Black Box models are chosen for the various sub-models. In Scenario-4, Non-Linear White Box models are constructed with a-priori process knowledge.

The best models among each of these scenarios and across these scenarios are determined based on example metrics, some of which are described above. Further, the best models are used to build model predictive controller and test various simulation cases.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

As will be appreciated by one skilled in the art, the subject matter disclosed herein may be embodied as a system, method or computer program product. Accordingly, this Disclosure can take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, this Disclosure may take the form of a computer program product embodied in any tangible medium of expression having computer usable program code embodied in the medium.

Any combination of one or more computer usable or computer readable medium(s) may be utilized. The computer-usable or computer-readable medium may be, for example, but not limited to, an electronic, magnetic, optical, electromagnetic, infrared, or semiconductor system, apparatus, or device. More specific examples (a non-exhaustive list) of the computer-readable medium would include non-transitory media including the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CDROM), an optical storage device, or a magnetic storage device.

Computer program code for carrying out operations of the disclosure may be written in any combination of one or more programming languages, including an object-oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The Disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a physical computer-readable storage medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

We claim:

1. A method of process control, comprising:
    representing a processing system that runs a physical process having a plurality of controlled variables (CVs) with some linear CVs and some non-linear CVs and a plurality of manipulated variables (MVs);
    independently developing a first linear sub-model for each of said plurality of MVs corresponding to said linear CVs a second non-linear sub-model for each of said plurality of MVs corresponding to said non-linear CVs;
    merging said first linear sub-model and said second non-linear sub-model to generate a first merged linear and non-linear model from dynamic process data from said processing system;
    repeating said independently developing and said merging to generate a second merged linear and non-linear model different from said first merged linear and non-linear model;
    simulating said physical process using a model predictive controller utilizing said first merged linear and non-linear model and then utilizing said second merged linear and non-linear model to obtain closed loop performance test data regarding at least one of said plurality of CVs for said first merged linear and non-linear model and for said second merged linear and non-linear model;
    comparing performance of said first merged linear and non-linear model with said second merged linear and non-linear model based on said closed loop performance test data, and
    selecting a selected process model from said first merged linear and non-linear model and said second merged linear and non-linear model.

2. The method of claim 1, wherein said method is run off-line from said physical process.

3. The method of claim 1, further comprising providing said selected process model to a hybrid process controller on-line with said physical process.

4. The method of claim 1, wherein said at least one linear process model includes a plurality of finite impulse response (FIR), closed loop identification (CLID), prediction error method (PEM) and combinations thereof, said at least one non-linear model includes a plurality of empirical data-based models including black-box (BB) models, grey-box (GB) models, and first-principle models including white-box (WB) models.

5. A system for controlling a physical process, comprising:
    a computing device including a processor and algorithms executed by said computing device implementing:
    a model development block for representing a processing system that runs a physical process having a plurality of controlled variables (CVs) with some linear CVs and some non-linear CVs and a plurality of manipulated variables (MVs) for independently developing a first linear sub-model for each of said plurality of MVs corresponding to said linear CVs a second non-linear sub-model for each of said plurality of MVs corresponding to said non-linear CVs from dynamic process data from said processing system;
    a model-based controller generation block coupled to receive said first linear sub-model and said second non-linear sub-model for merging said first linear sub-model and said second non-linear sub-model to generate a first merged linear and non-linear model;
    wherein said model development block is further for repeating said independently developing and said merging to generate a second merged linear and non-linear model different from said first merged linear and non-linear model;
a simulator block for simulating said physical process using a model predictive controller utilizing said first merged linear and non-linear model and then utilizing said second merged linear and non-linear model to obtain closed loop performance test data regarding at least one of said plurality of CVs for said first merged linear and non-linear model and for said second merged linear and non-linear model;
a comparing block coupled to said simulator block for comparing performance of said first merged linear and non-linear model with said second merged linear and non-linear model based on said closed loop performance test data, and
a selection block for selecting a selected process model from said first merged linear and non-linear model and said second merged linear and non-linear model.

6. The system of claim 5, wherein said method is run off-line from said physical process.

7. The system of claim 5, wherein said selected process model is provided to a hybrid process controller on-line with said physical process.

8. The system of claim 5, wherein said at least one linear process model includes a plurality of finite impulse response (FIR), closed loop identification (CLID), prediction error method (PEM) and combinations thereof, said at least one non-linear model includes a plurality of empirical data-based models including black-box (BB) models, grey-box (GB) models, and first-principle models including white-box (WB) models.

* * * * *